United States Patent
Lo et al.

(10) Patent No.: US 9,634,873 B1
(45) Date of Patent: Apr. 25, 2017

(54) BPSK DEMODULATOR

(71) Applicant: NATIONAL CHIAO TUNG UNIVERSITY, Hsinchu (TW)

(72) Inventors: Chi-Yi Lo, Hsinchu (TW); Hao-Chiao Hong, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 15/146,368

(22) Filed: May 4, 2016

(30) Foreign Application Priority Data

Jan. 25, 2016 (TW) .............................. 105102160 A

(51) Int. Cl.
| | |
|---|---|
| H03K 9/06 | (2006.01) |
| H04L 27/22 | (2006.01) |
| H04L 27/227 | (2006.01) |
| H04L 7/00 | (2006.01) |
| H04L 7/033 | (2006.01) |

(52) U.S. Cl.
CPC ........ H04L 27/2275 (2013.01); H04L 7/0041 (2013.01); H04L 7/033 (2013.01)

(58) Field of Classification Search
USPC .......... 375/219, 220, 222, 221, 240, 240.26, 375/240.27, 271, 279, 280, 282, 283, 284, 375/285, 295, 302, 308, 300, 316, 322, 375/324, 329, 330, 331, 332, 333, 340, 375/346, 347
See application file for complete search history.

(56) References Cited

U.S. PATENT DOCUMENTS

| | | | | | |
|---|---|---|---|---|---|
| 4,849,990 | A * | 7/1989 | Ikegami | .................... | H04L 1/02 375/267 |
| 6,424,682 | B1 * | 7/2002 | Enguent | ............. | G06K 7/10336 332/104 |
| 7,366,235 | B2 * | 4/2008 | Mimura | ............. | H04B 1/71637 370/213 |
| 8,311,082 | B2 * | 11/2012 | Pasternak | ............. | H01Q 1/125 375/219 |
| 2004/0205438 | A1 * | 10/2004 | Chien | .................... | H03M 13/00 714/746 |
| 2006/0057996 | A1 * | 3/2006 | Petrovic | .................... | H03D 3/007 455/260 |
| 2009/0304061 | A1 * | 12/2009 | Kamalizad | ............... | H04B 3/54 375/228 |
| 2012/0027051 | A1 * | 2/2012 | Lakkis | ............... | H04B 1/71632 375/146 |
| 2014/0086345 | A1 * | 3/2014 | Huh | .................... | H04B 5/0031 375/256 |
| 2016/0127162 | A1 * | 5/2016 | Doi | ........................ | H04L 27/361 375/271 |
| 2016/0197761 | A1 * | 7/2016 | Chang | .................... | G11C 5/063 375/308 |

* cited by examiner

*Primary Examiner* — Linda Wong
(74) *Attorney, Agent, or Firm* — Muncy, Geissler, Olds & Lowe, P.C.

(57) ABSTRACT

The present invention discloses BPSK demodulator, which uses a delay circuit to delay a BPSK signal and mixes the delayed BPSK signal with the undelayed BPSK signal to output a demodulated data signal, and which uses a phase rotation circuit and the demodulated data signal to obtain a carrier clock signal. The operating frequency of the delay circuit is the same as or 0.5 times the carrier frequency. Therefore, the present invention consumes less power and is realized by digital circuits and analog circuits.

17 Claims, 11 Drawing Sheets

BPSK DEMODULATOR

BACKGROUND OF THE INVENTION

1. Field of the Invention

The present invention relates to a BPSK demodulator, particularly to a low power consumption BPSK demodulator.

2. Description of the Prior Art

The conventional coherent binary phase shift keying (BPSK) demodulators can be classified into the Squaring loop and the Costas loop. The Squaring loop retrieves the carrier frequency signal with a squaring operation and doubles the carrier frequency. Thus, the Squaring loop needs a phase-locked loop (PLL) to lock the signal at the doubled carrier frequency. The phase-locked loop locking the doubled carrier frequency consumes more power. The Costas loop includes two parallel phase-locked loops, which are respectively the I branch and the Q branch with a 90-degree phase difference therebetween. In a general approach, an oscillator generates a signal with a doubled carrier frequency; then an orthogonal signal generator generates two signals having the same frequency and a 90-degree phase difference therebetween. The oscillator is locked at the doubled carrier frequency, consuming more power also. Therefore, the conventional coherent BPSK demodulators have the features: 1. high power consumption, whose reason has been mentioned above; 2. limited data rate, which is because the data rate is limited by the setting time of the phase-locked loop; 3. complicated circuits, which are because the phase-locked loop is a more complicated feedback system; 4. large layout area, which is because the loop filter occupies much area and is unfavorable for biomedicine application.

The devices, which stringently demand low power consumption and low heat radiation, such as implanted biomedicine chips, environment monitoring systems, and Internet of Things (IoT), need a low-power consumption and small-area demodulator to receive data. The conventional demodulators are hard to satisfy the abovementioned requirements because they consume too high a proportion of power used by the overall system.

Thus, the manufacturers in the field are making much effort to develop a low power consumption BPSK demodulator.

SUMMARY OF THE INVENTION

The present invention provides a binary phase shift keying (BPSK) demodulator, which uses a delay circuit to delay a BPSK signal and mixes the delayed BPSK signal with the undelayed BPSK signal to output a demodulated data signal, wherein the operating frequency of the delay circuit is equal to or half a carrier frequency so as to significantly reduce the power consumption and be realized the BPSK demodulator by digital circuits and analog circuits.

In one embodiment, the BPSK demodulator of the present invention comprises a delay circuit and a decision circuit. The delay circuit receives a BPSK signal and delays the BPSK signal by an accumulated delay time to output an accumulated delayed signal. The decision circuit is electrically connected with the delay circuit, and comprises a first XOR gate and a flip-flop. The first XOR gate mixes the BPSK signal and the accumulated delayed signal to output a heterodyning signal, and the flip-flop is electrically connected with the first XOR gate and changes a demodulated data signal output by the flip-flop according to a logic state of the heterodyning signal.

Below, embodiments are described in detail in cooperation with the attached drawings to make easily understood the objectives, technical contents, characteristics and accomplishments of the present invention.

DESCRIPTION OF THE PREFERRED EMBODIMENTS

Figure 1:
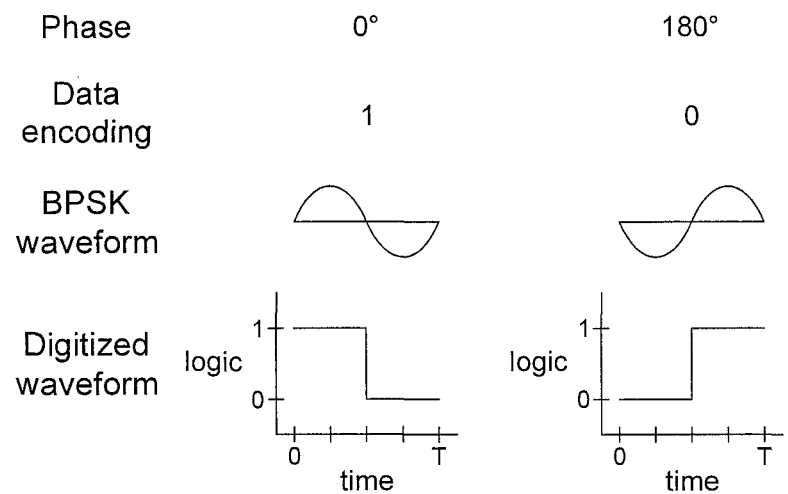
FIG. 1 is a timing diagram showing a typical BPSK signal.

The present invention will be described in detail with embodiments and attached drawings below. However, these embodiments are only to exemplify the present invention but not to limit the scope of the present invention. In addition to the embodiments described in the specification, the present invention also applies to other embodiments. Further, any modification, variation, or substitution, which can be easily made by the persons skilled in that art according to the embodiment of the present invention, is to be also included within the scope of the present invention, which is based on the claims stated below. Although many special details are provided herein to make the readers more fully understand the present invention, the present invention can still be practiced under a condition that these special details are partially or completely omitted. Besides, the elements or steps, which are well known by the persons skilled in the art, are not described herein lest the present invention be limited unnecessarily. Similar or identical elements are denoted with similar or identical symbols in the drawings. It should be noted: the drawings are only to depict the present invention schematically but not to show the real dimensions or quantities of the present invention. Besides, matterless details are not necessarily depicted in the drawings to achieve conciseness of the drawings.

Refer to FIG. 1 for the description of timing. A BPSK demodulator can distinguish the phases of an input modulated signal, which have a 180-degree phase difference therebetween, and output the encoding information representing each phase. For example, the waveform of the input modulated signal whose phase is 0 degrees is characterized in a logic state of 1 within the time interval of 0-T/2 and a logic state of 0 within the time interval of T/2-T, wherein T is the period of the signal; the waveform of the input demodulation signal whose phase is 180 degrees is characterized in a logic state of 0 within the time interval of 0-T/2 and a logic state of 1 within the time interval of T/2-T. However, the present invention does not particularly limit that the relationship between the phase of the input demodulation signal and the encoding information of the phase must be the same as mentioned above.

Figure 2:
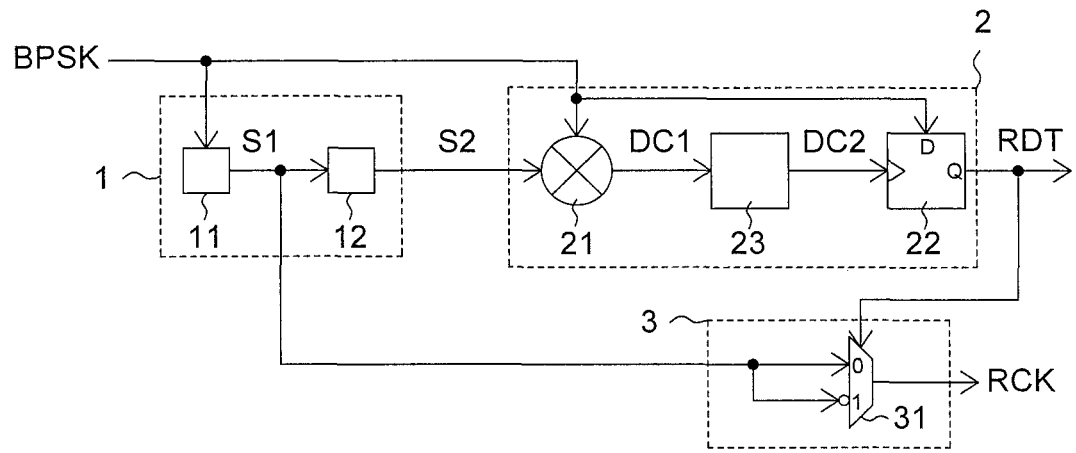
FIG. 2 is a diagram schematically showing a BPSK demodulator according to one embodiment of the present invention.
Figure 3:
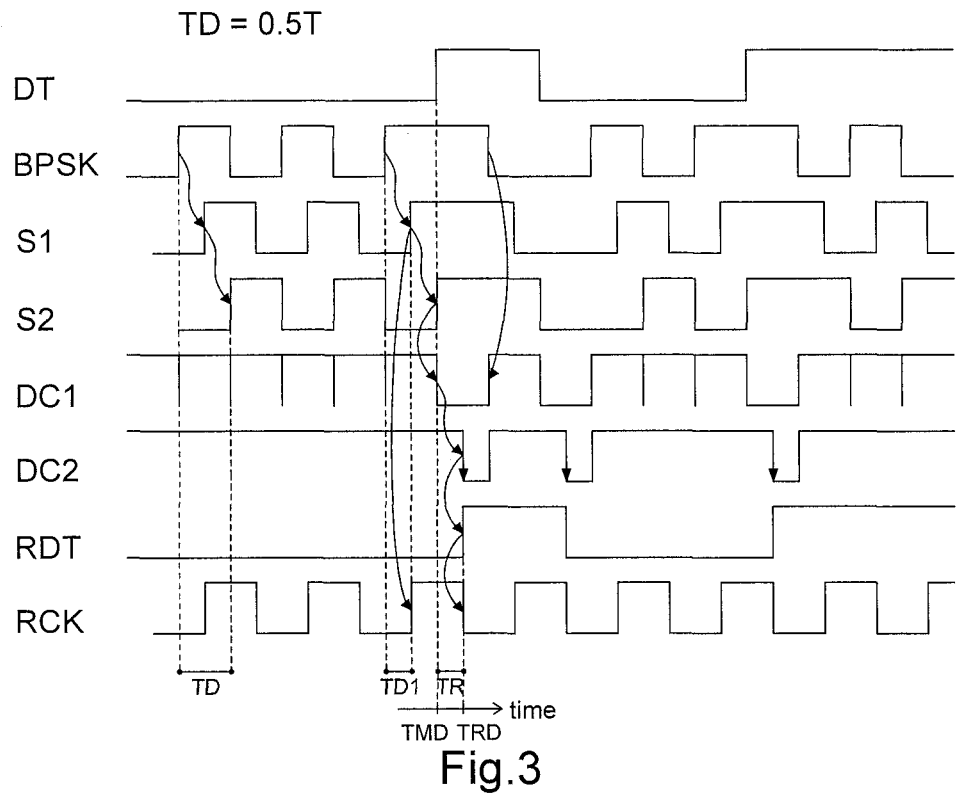
FIG. 3 is a timing diagram showing the signals related with a BPSK demodulator according to one embodiment of the present invention.

Refer to FIG. 2 and FIG. 3, wherein a raw data signal DT is modulated into a binary phase shift keying (BPSK) signal, and the BPSK signal is transmitted to a BPSK demodulator. Refer to FIG. 2. In one embodiment, the BPSK demodulator of the present invention comprises a delay circuit 1, a decision circuit 2 and a phase rotation circuit 3. The delay circuit 1 includes a first delay element 11 and a second delay element 12. The first delay element 11 receives the BPSK signal, delays the BPSK signal by a first delay time TD1, and outputs a first delayed signal S1 to the rotation circuit 3. The second delay element 12 receives the first delayed signal S1, delays the first delayed signal S1 by a second delay time TD2, and outputs a second delayed signal as an accumulated delayed signal S2 to the decision circuit 2.

It should be noted: the accumulated delay time meets the following relationships: TD=TD1+TD2, and 0.25T≤TD<((F/R)−0.25) T, wherein TD is the accumulated delay time, TD1 the first delay time, and TD2 the second delay time, and wherein T is the carrier period of the BPSK signal, F the carrier frequency of the BPSK signal, and R the data rate of the BPSK signal. In the embodiment shown in FIG. 3, the data-rate-to-carrier-frequency ratio of the BPSK signal is (F/R)=(1/1)=1. Therefore, the accumulated delay time TD meets the following relationships: TD=TD1+TD2, and 0.25T<TD<0.75T, wherein TD is the accumulated delay time, TD1 the first delay time, TD2 the second delay time, and T the carrier period of the BPSK signal.

Refer to FIG. 2 and FIG. 3 again. The decision circuit 2 includes a first exclusive OR (XOR) gate 21, a first hazard-remover 23, and a flip-flop (FF) 22. The first XOR gate 21 mixes the BPSK signal and the accumulated delayed signal S2 to output a heterodyning signal DC1. The first hazard-remover 23 is arranged between and cascaded with the first XOR gate 21 and the flip-flop 22, removing the hazard of the heterodyning signal DC1 by decreasing the pulse width of the heterodyning signal DC1 to generate a transition signal DC2. In one embodiment, the flip-flop 22 is a D-type flip-flop, receiving the transition signal DC2 and the BPSK signal and sampling the BPSK signal according to the logic state of the transition signal DC2 to output a demodulated data signal RDT. However, the present invention does not particularly limit that the flip-flop 22 must be a D-type flip-flop. In one embodiment, the flip-flop 22 is a T-type flip-flop, receiving the transition signal DC2 and changing the data logic state of the demodulated data signal RDT, which is output by the output terminal of the T-type flip-flop, according to the logic state of the transition signal DC2. Then, the comparison verifies that the demodulated data signal RDT demodulated by the BPSK demodulator is the same as the raw data signal DT.

Figure 4:
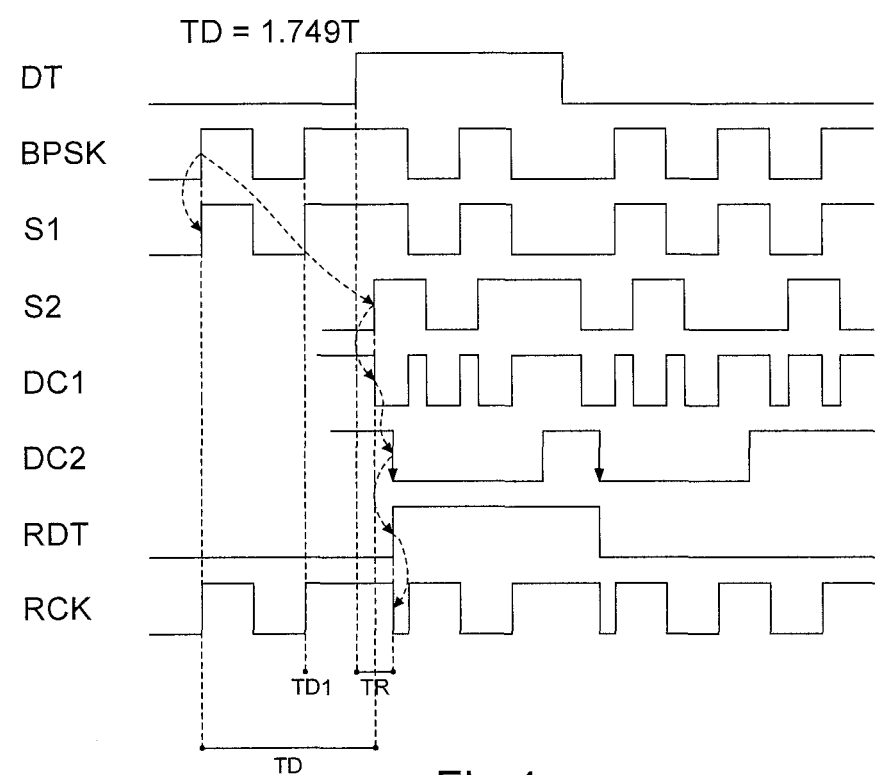
FIG. 4 is another timing diagram showing the signals related with a BPSK demodulator according to one embodiment of the present invention.
Figure 5:
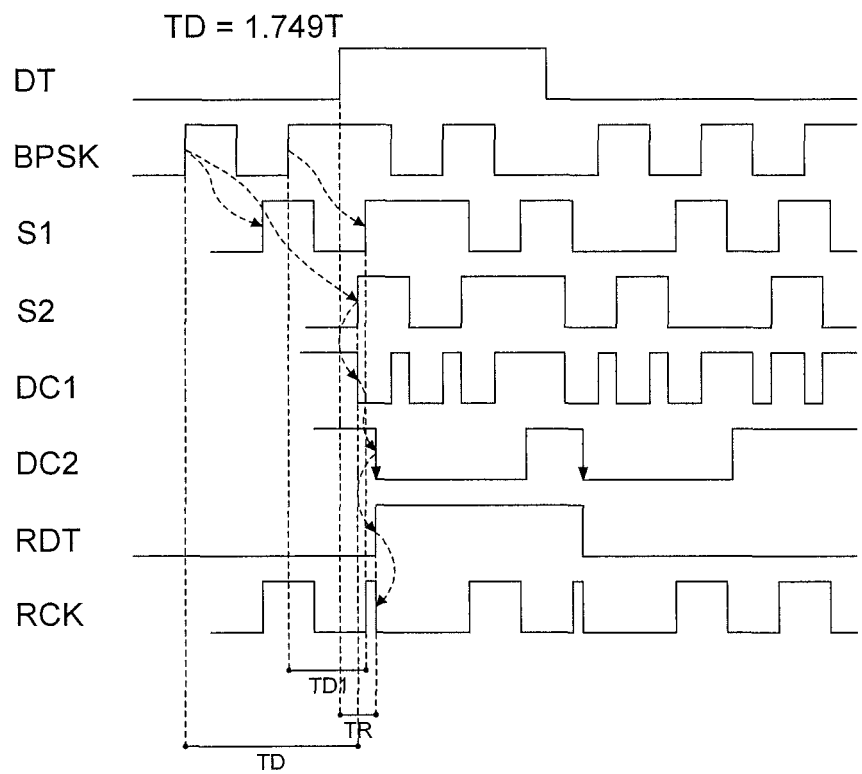
FIG. 5 is another timing diagram showing the signals related with a BPSK demodulator according to one embodiment of the present invention.

In order to acquire a correct demodulated data signal RDT, the flip-flop 22 in FIG. 2 may adopt a rising edge triggered flip-flop or a falling edge triggered flip-flop according to the practical requirement in some embodiments. It is easily understood: a substitute of the falling edge triggered flip-flop can be formed via arranging an inverter in one of the two input terminals of the XOR gate 21 or the output terminal of the XOR gate 21 cooperating with a conventional rising edge triggered flip-flop. Refer to Table. 1 which lists the ranges of the accumulated delay time and the corresponding flip-flops. Refer to FIG. 2 and FIG. 3 again. For example, while the accumulated delay time TD is 0.5T, an inverter (not shown in the drawings) is arranged at the output terminal of the second delay element 12 before the first XOR gate 21, whereby to make the accumulated delayed signal S2 is an opposite-phase signal of the first delayed signal S1. Refer to FIG. 2, FIG. 4 and FIG. 5. In one embodiment, while the accumulated delay time TD is 1.749T, neither the front terminals nor the rear terminals of the first XOR gate 21 need an inverter, i.e. the accumulated delayed signal S2 needn't be output in the opposite phase. However, the present invention is not limited by the embodiments. The persons skilled in the art can modify or vary the abovementioned embodiments to make the decision circuit function normally without departing from the spirit of the present invention.

TABLE 1

| Range of Accumulated Delay Time | Type of FF |
|---|---|
| 0.25T-0.75T | falling edge triggered |
| 0.75T-1.25T | rising edge triggered |
| 1.25T-1.75T | falling edge triggered |
| 1.75T-2.25T | rising edge triggered |

In one embodiment, the first hazard-remover 23 is used to remove hazards. For example, the pulse with a positive pulse width less than or equal to 0.25T is regarded as a positive hazard, and a pulse with a negative width less than or equal to 0.25T is regarded as a negative hazard, i.e. a noise. The first hazard-remover 23 filters out the positive hazard and the negative hazard.

In addition to outputting a demodulated data signal, the BPSK demodulator of the present invention also outputs a carrier clock signal for the other electronic components in the system. It should be noted: a stable period of the rising edges of the clock signal is sufficient for ordinary electronic elements. In one embodiment, the carrier clock signal output by the BPSK demodulator of the present invention also has a stable period of the falling edges. Therefore, the BPSK demodulator of the present invention is also applied to high-end circuit designs. Below is described how the BPSK demodulator of the present invention generates a carrier clock signal. Refer to FIG. 2 and FIG. 3 again. The phase rotation circuit 3 is electrically connected with the delay circuit 1 and the decision circuit 2, rotating the phase of the first delayed signal S1 output by the delay circuit 1 by 180 degrees according to the demodulated data signal RDT output by the decision circuit 2 to output a carrier clock signal RCK. The principle of the phase rotation circuit is: while a control signal is a low-level signal (i.e. "0" in the digital signal), the phase rotation circuit lets a signal pass directly; while a control signal is a high-level signal (i.e. "1" in the digital signal), the phase rotation circuit lets a signal pass in an opposite phase. The phase rotation circuit may be realized by a multiplexer, an XOR gate, an analog multiplier, a mixer, or a Gilbert cell. However, the present invention does not particularly limit that the phase rotation circuit must be realized by one of the abovementioned elements. In one embodiment, the phase rotation circuit 3 includes a multiplexer 31; while the demodulated data signal RDT output by the flip-flop 22 is a "0" signal, the multiplexer 31 lets the first delayed signal S1 pass directly; while the demodulated data signal RDT output by the flip-flop 22 is a "1" signal, the multiplexer 31 lets the first delayed signal S1 pass in an opposite phase, whereby is output the carrier clock signal RCK. As shown in FIG. 3, the carrier clock signal RCK has a stable period of the rising edges and a stable period of the falling edges and thus can provide the working clock for high-end circuit designs, such as the Double-Data-Rate Two Synchronous Dynamic Random Access Memory (DDR2 SDRAM), which needs to transmit data in the rising edges and falling edges of the working clock.

Refer to FIG. 3 again. In order to solve the carrier clock signal, the first delay time must meet the following relationships: Max{0, TR−0.5T}≤TD1<TR+0.5T, and TR=TMD−TRD, wherein TD1 is the first delay time, TMD the time point of the transition of the raw data signal DT, TRD the time point of the transition of the demodulated data signal RTD, and TR the time to demodulate the data signal. Below is explained the timing diagrams corresponding to the inequality in different embodiments.

Refer to FIG. 2 and FIG. 4. In one embodiment, the accumulated delay time TD is 1.749T; the time for the transition of the demodulated data signal TR is that shown in FIG. 4; the first delay time TD1 is 0, i.e. the minimum value in the abovementioned inequality. Form the timing diagram in FIG. 4, it is learned: the phase rotation 3 rotates the phase of the first delayed signal S1 output by the delay circuit 1 by 180 degrees according to the demodulated data signal RDT output by the decision circuit 2. Refer to FIG. 2 and FIG. 5. In one embodiment, the accumulated delay time TD is 1.749T; the time for the transition of the demodulated data signal TR is that shown in FIG. 5; the first delay time TD1 is TR+0.4T, which approaches the maximum value of the abovementioned inequality. Form the timing diagram in FIG. 5, it is learned: the phase rotation 3 also rotates the phase of the first delayed signal S1 output by the delay circuit 1 by 180 degrees according to the demodulated data signal RDT output by the decision circuit 2.

Figure 6:
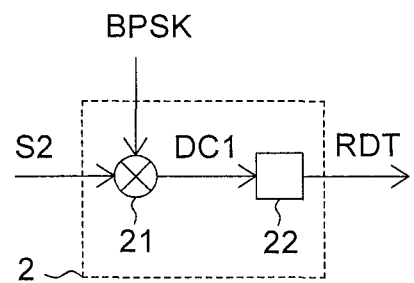
FIG. 6 is a diagram schematically showing a decision circuit according to another embodiment of the present invention.

The persons with ordinary knowledge in the field should be able to modify, vary, or substitute the embodiments of the present invention without departing from the spirit of the present invention. For example, an ordinary circuit architecture is apt to resist a high-frequency hazard inherently and thus less likely to be affected by the high-frequency hazard and able to operate normally in a stable operation environment. For instance, the decision circuit 2 can operate normally in the environment of FIG. 6. If the designer intends to enhance the wave-filtering effect, he may add the first hazard-remover 23 shown in FIG. 2 into the circuit design. However, the present invention does not particularly limit that the circuit of the present invention must have a hazard-remover.

It should be noted: a portion of the characteristics in the abovementioned embodiments are selective and can be optionally used in different applications or circuit designs. Although these characteristics, such as the second delay element 12, the first hazard-remover 33 and the multiplexer 31 in the embodiment of FIG. 2, are respectively described in different embodiments, they can be used separately or jointly.

Figure 7:
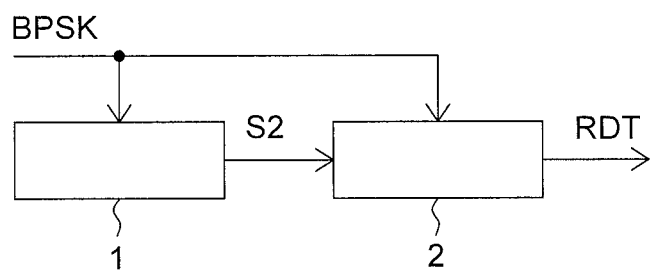
FIG. 7 is a diagram schematically showing a BPSK demodulator according to another embodiment of the present invention.

Refer to FIG. 7. In one embodiment, the BPSK demodulator of the present invention comprises a delay circuit 1 and a decision circuit 2. The delay circuit 1 receives a BPSK signal, delays the BPSK signal by an accumulated delay time, and outputs an accumulated delayed signal S2. The decision circuit 2 is electrically connected with the delay circuit 1, mixes the BPSK signal and the accumulated delayed signal S2 to generate a heterodyning signal, and changes a demodulated data signal RDT output by the decision circuit 2 according to the heterodyning signal. In this embodiment, it is unnecessary for the delay circuit 1 to have two delay elements. The delay circuit 1 may have only a single delay element. This embodiment will be described in detail below.

Figure 8:
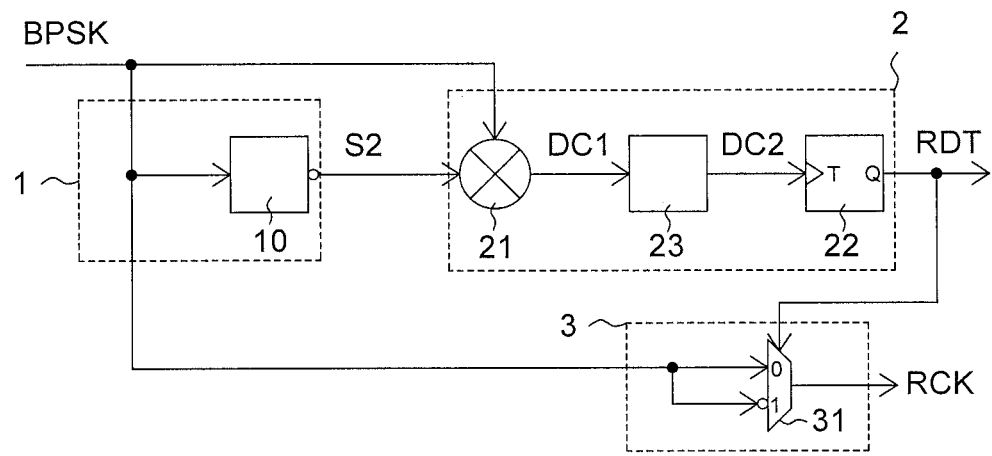
FIG. 8 is a diagram schematically showing a BPSK demodulator according to still another embodiment of the present invention.
Figure 9:
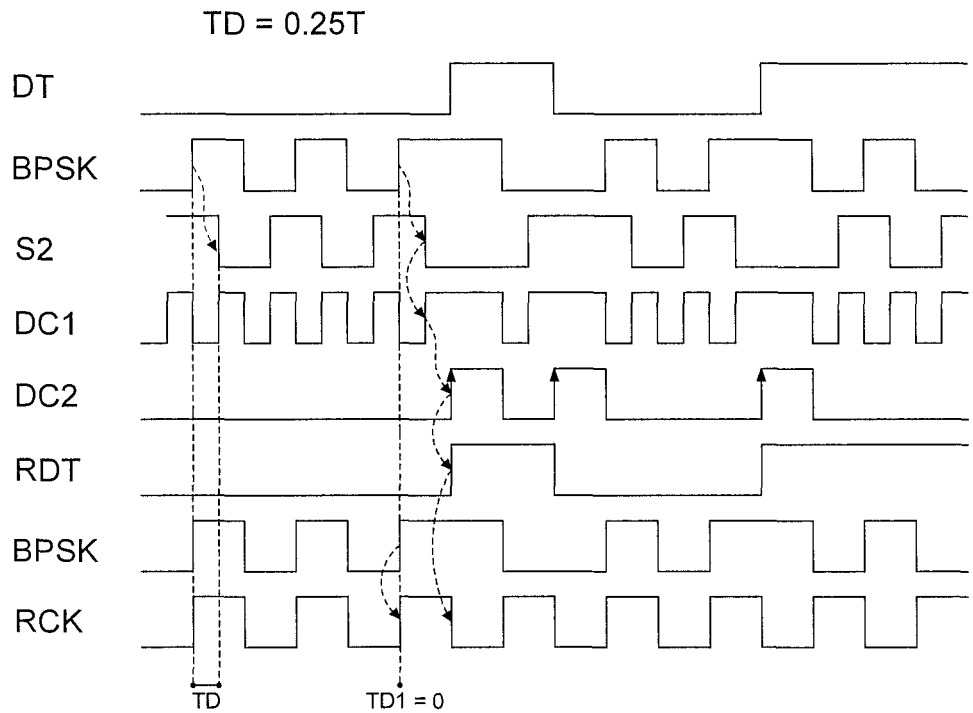
FIG. 9 is a timing diagram showing the signals related with a BPSK demodulator according to still another embodiment of the present invention.
Figure 10:
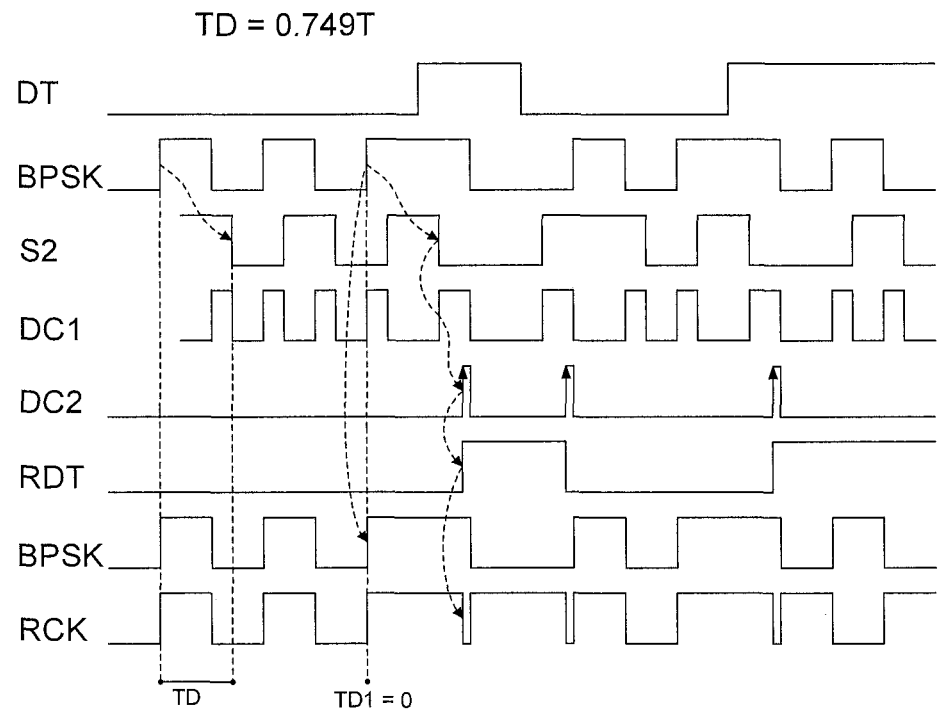
FIG. 10 is another timing diagram showing the signals related with a BPSK demodulator according to still another embodiment of the present invention.

Refer to FIGS. 8-10 also. The connection and operating principle of the delay circuit 1, the decision circuit 2 and the phase rotation circuit 3 in FIGS. 8-10 have been described above and will not repeat herein. In this embodiment, the data-rate-to-carrier-frequency ratio of the BPSK signal is 1, i.e. (F/R)=(1/1)=1. Therefore, the accumulated delay time TD satisfies the following relationship: 0.25T≤TD<0.75T, wherein TD is the accumulated delay time and T is the period of the carrier of the BPSK signal. It should be explained: the delay circuit 1 includes an accumulated delay element 10. The accumulated delay element 10 receives a BPSK signal, delays the BPSK signal by an accumulated delay time TD, and outputs an accumulated delayed signal S2. The flip-flop 22 is a T-type flip-flop 22, receiving a transition signal DC2, and changing the data logic state of the demodulated data signal RDT output by the output terminal of the T-type flip-flop according to the logic state of the transition signal DC2. For example, while a pulse appears in the transition signal DC2, the output terminal of the T-type flip-flop instantly changes the logic state of the demodulated data signal RDT. The phase rotation circuit 3 includes a multiplexer 31, rotating the phase of the BPSK signal by 180 degrees according to the demodulated data signal RDT output by the decision circuit 2 and outputting a carrier clock signal RCK.

Whether the operating rage of the delay circuit 1 in FIG. 8 is within $0.25T \leq TD < 0.75T$ is verified below. For embodiments where TD<0.75T, refer to FIG. 9 for a timing diagram where the accumulated delay time of the delay circuit is 0.25T, i.e. TD=0.25T, and refer to FIG. 10 for a timing diagram where the accumulated delay time of the delay circuit is 0.749T, i.e. TD=0.749T, From FIG. 9 and FIG. 10, it is learned: the demodulated data signal RDT recovered by the BPSK demodulator is the same as the raw data signal DT. Besides, the rising edges of the carrier clock signal RCK have a stable period and thus can function as the working clock of ordinary electronic elements.

Figure 11:
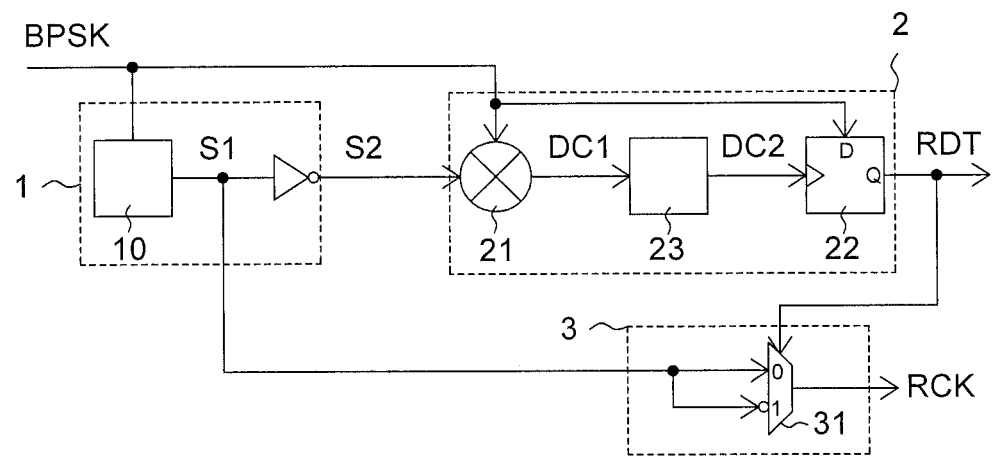
FIG. 11 is a diagram schematically showing a BPSK demodulator according to yet another embodiment of the present invention.
Figure 12:
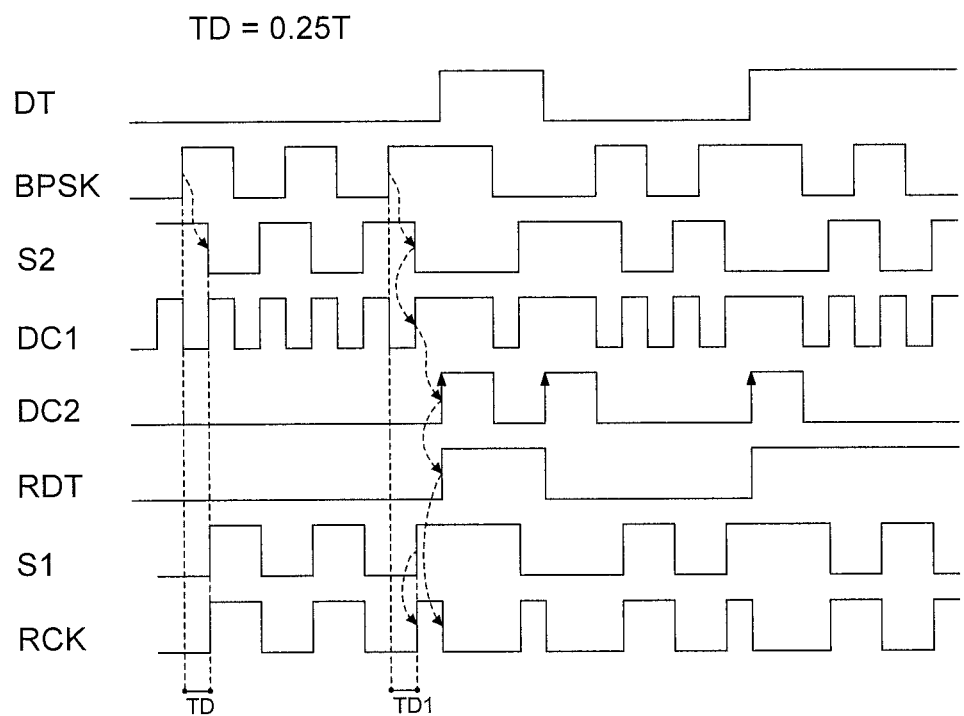
FIG. 12 is a timing diagram showing the signals related with a BPSK demodulator according to yet another embodiment of the present invention.
Figure 13:
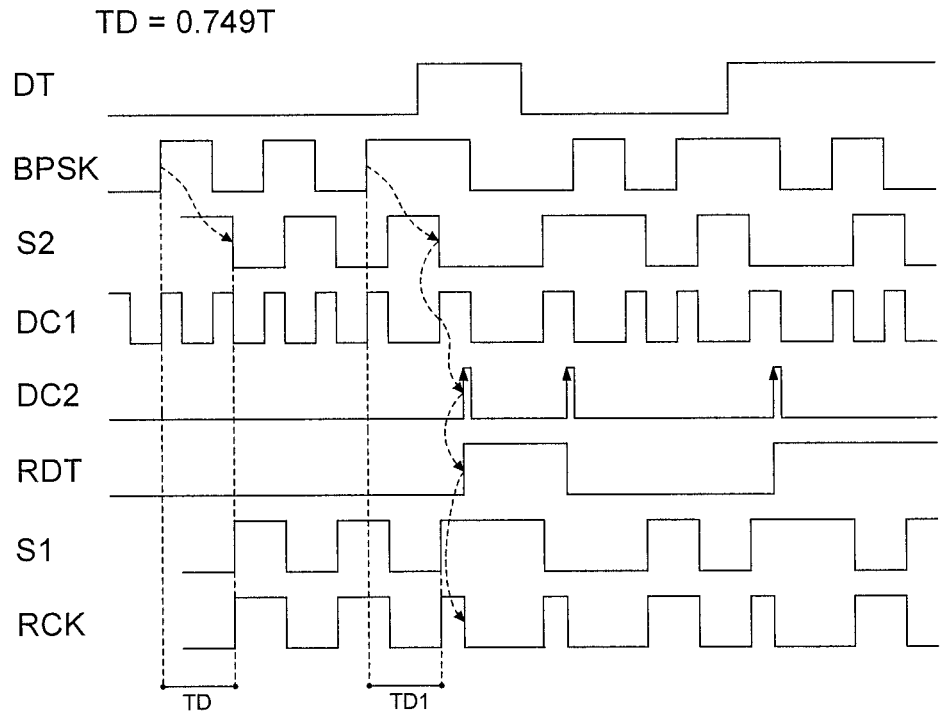
FIG. 13 is another timing diagram showing the signals related with a BPSK demodulator according to yet another embodiment of the present invention.

Refer to FIGS. 11-13. The connection and operating principle of the delay circuit 1, the decision circuit 2 and the phase rotation circuit 3 in FIGS. 11-13 have been described above and will not repeat herein. In this embodiment, the data-rate-to-carrier-frequency ratio of the BPSK signal is 1, i.e. (F/R)=(1/1)=1. Therefore, the accumulated delay time TD satisfies the following relationship: $0.25T \leq TD < 0.75T$, wherein TD is the accumulated delay time and T is the period of the carrier of the BPSK signal. The embodiment of FIG. 11 is different from the embodiment of FIG. 8 in that the phase rotation circuit 3 in FIG. 11 receives the accumulated delayed signal S1 output by the delay circuit 1 and the demodulated data signal RDT output by the flip-flop 22 so as to output the carrier clock signal RCK. The multiplexer 31 rotates the phase of the accumulated delayed signal S1 output by the delay circuit 1 by 180 degrees according to the demodulated data signal RDT output by the flip-flop 22 and outputs a carrier clock signal RCK.

Whether the operating rage of the delay circuit 1 in FIG. 11 is within $0.25T \leq TD < 0.75T$ is verified below. Refer to FIG. 12 for a timing diagram where the accumulated delay time of the delay circuit is 0.25T, i.e. TD=0.25T, and refer to FIG. 13 for a timing diagram where the accumulated delay time of the delay circuit is 0.749T, i.e. TD=0.749T. From FIG. 12 and FIG. 13, it is learned: the demodulated data signal RDT recovered by the BPSK demodulator is the same as the raw data signal DT. Besides, the rising edges of the carrier clock signal RCK have a stable period and thus can function as the working clock of ordinary electronic elements.

In summary, the BPSK demodulator of the present invention uses a delay circuit (i.e. the delay line) to delay a BPSK signal and mixes the delayed BPSK signal with an undelayed BPSK signal to output a demodulated data signal. Further, the BPSK demodulator of the present invention uses a phase rotation circuit and the demodulated data signal to obtain a carrier clock signal.

Figure 14:
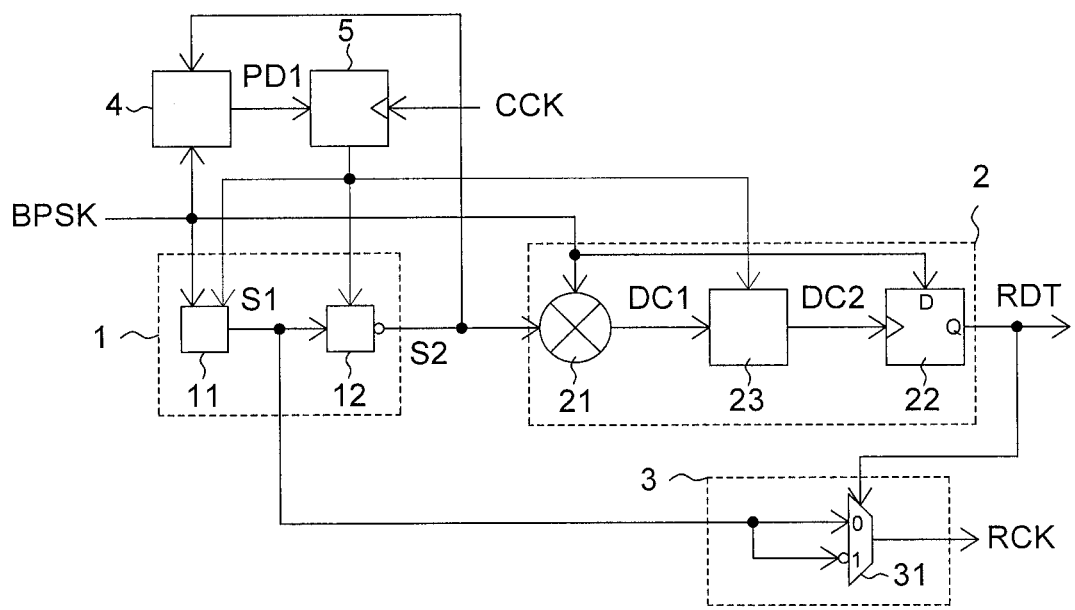
FIG. 14 is a diagram schematically showing a BPSK demodulator according to further another embodiment of the present invention.

In one embodiment, the delay circuit is controlled by a delay-locked loop (DLL) and functions as a delay line of the delay-locked loop. Refer to FIG. 14. In one embodiment, the BPSK demodulator of the present invention comprises a delay circuit 1, a decision circuit 2, a phase rotation circuit 3, a phase detector 4, and a controller 5. The delay circuit 1, the phase detector 4 and the controller 5 jointly form a delay-locked loop. The phase detector 4 detects the phase difference of the BPSK signal and the accumulated delayed signal S2 and outputs a comparison signal PD1. The controller 5 is electrically connected with the phase detector 4, the delay circuit 1, and the hazard-remover 23, controlling the accumulated delay time of the delay circuit and the widest hazard that can be removed by the hazard-remover according to the comparison signal PD1. For example, the controller 5 uses the delay-locked loop to lock the first delay time and the second delay time of the delay circuit 1 at 0.25T. In one embodiment, the controller 5 receives the carrier clock signal RCK as a control clock signal CCK. It is easily understood: the control clock signal required by the controller 5 can be supplied by an external circuit as long as the frequency of the control clock signal CCK is the same as the frequency of the carrier clock signal RCK. However, the present invention does not particularly limit the source of the control clock signal. After locking, the controller 5 turns off the delay-locked loop to make the delay circuit 1 restored to be an open-loop delay line, whereby to tolerate process variations.

Figure 15:
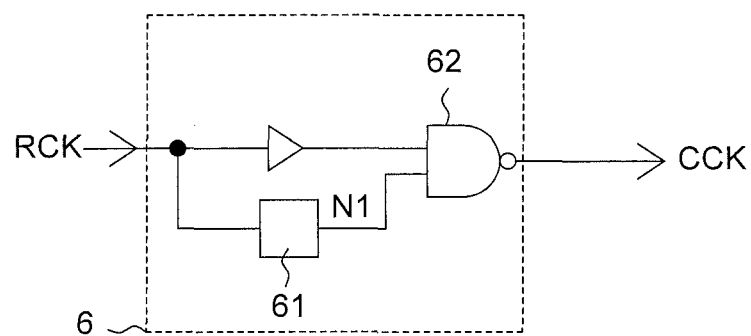
FIG. 15 is a diagram schematically showing a control clock generator according to further another embodiment of the present invention.
Figure 16:
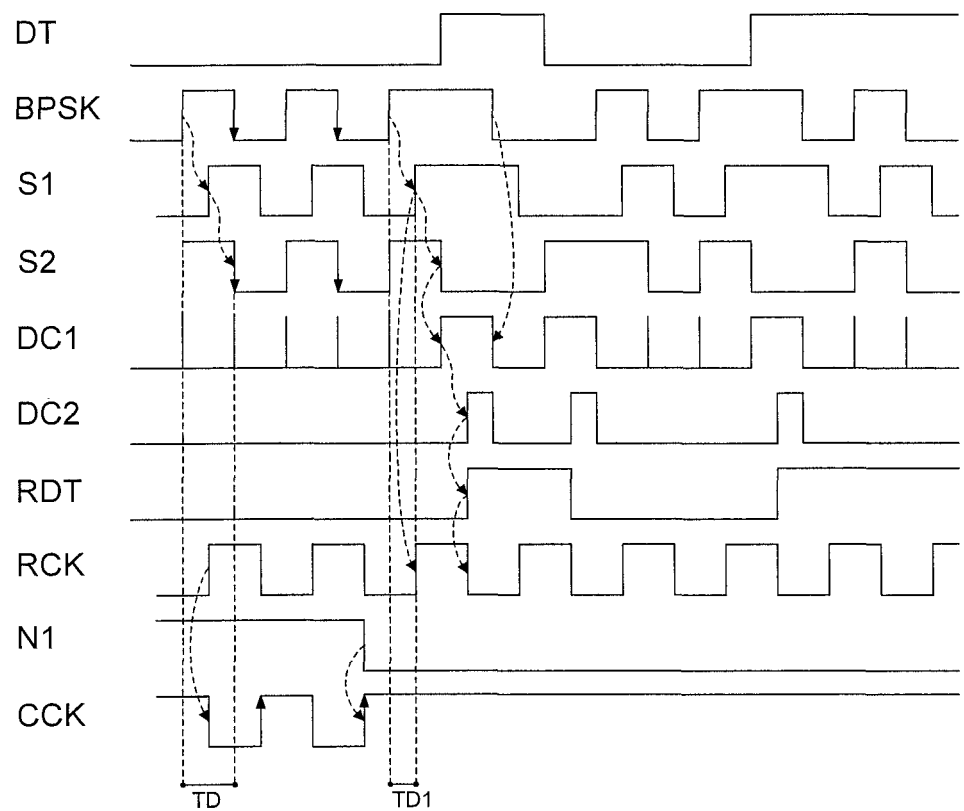
FIG. 16 is a timing diagram showing the signals related with a BPSK demodulator according to further another embodiment of the present invention.

Refer to FIGS. 14-16. In one embodiment, the BPSK demodulator of the present invention comprises a delay circuit 1, a decision circuit 2, a phase rotation circuit 3, a phase detector 4, a first controller 5, and a control clock generator 6. As shown in FIG. 15, the control clock generator 6 includes a second controller 61 and a NAND gate 62 and outputs a control clock signal CCK to the first controller 5. The second controller 61 receives the carrier clock signal RCK and outputs a first control signal N1 of "0" after it has counted N cycles of the carrier clock signal RCK. The NAND gate 62 receives the first control signal N1 and the carrier clock signal RCK to undertake a NAND operation and outputs a control clock signal CCK to the first controller 5. Thereby, the first controller 5 uses the front N bits of training sequence of the BPSK signal to lock the delay circuit 1, wherein N is a natural number. In one embodiment, the first delay time TD1 and the second delay time TD2 of the delay circuit 1 are the same, and both are locked and controlled by the first controller 5. Suppose that the first controller 5 has a tuning range of 5 bits. If a successive approximation method is used, the locking will be achieved within maximum 5 cycles. After locking, the delay-locked loop is turned off. In one embodiment, after N cycles pass, the second controller 61 of the control clock generator 6 restores the delay circuit to be an open-loop state, whereby to tolerate process variations. In other words, the controller only undertakes locking within the beginning few cycles and no more acts after the beginning few cycles. The operating principles of the other circuits have been described above and will not repeat herein.

It should be noted: the controller of the delay-locked loop in the embodiment of FIG. 15 and FIG. 16 adopts a foreground calibration, wherein a small section of training sequence in the front of the BPSK signal is used to lock the delay circuit to achieve a correct delay time. However, a background calibration is adopted by the controller of the delay-locked loop of the BPSK demodulator in another embodiment, wherein after data transmission begins, the delay-locked loop continues locking the delay circuit to achieve a correct delay time. Below is described the operating principle and efficacy thereof.

It is easily understood: the phase is inverted by 180 degrees while the modulated data of the BPSK signal changes between logic 0 and logic 1, which is likely to make the phase detector detect incorrectly. Therefore, the BPSK demodulator uses the control clock generator to control the locking actions, wherein while the inversion of the phase of the BPSK signal occurs, the controller is forbidden changing the control code lest wrong locking happens. After data transmission begins, the locking actions are still undertaken in the background calibration method, whereby to counteract the variations of the process, voltage and temperature and enhance the reliability of the circuit.

Figure 17:
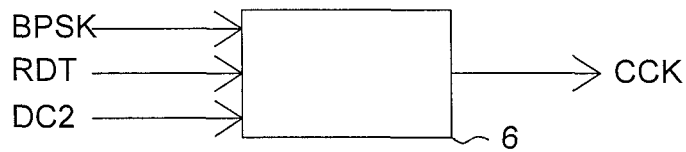
FIG. 17 is a diagram schematically showing a control clock generator according to a yet further embodiment of the present invention.
Figure 18:
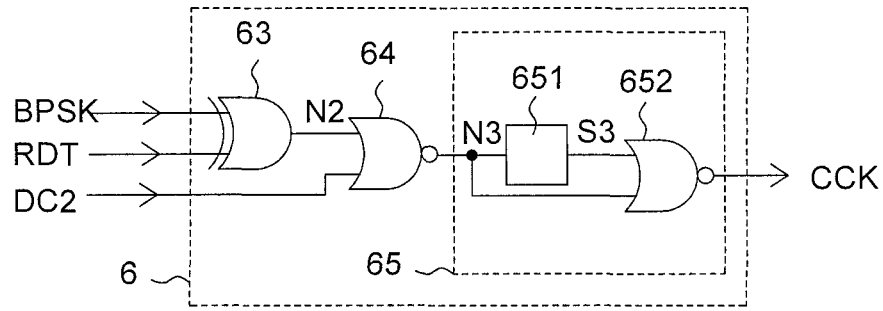
FIG. 18 is another diagram schematically showing a control clock generator according to a yet further embodiment of the present invention.
Figure 19:
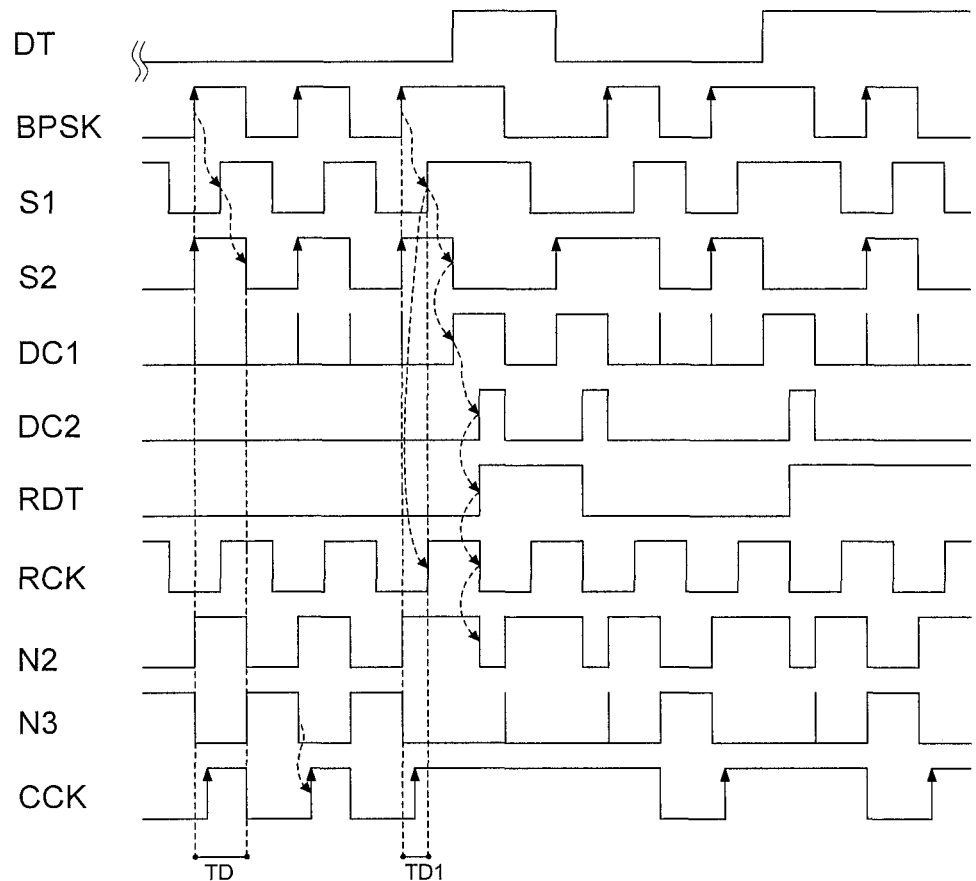
FIG. 19 is a timing diagram showing the signals related with a BPSK demodulator according to a yet further embodiment of the present invention.

Refer to FIG. 17. In one embodiment, the control clock generator 6 receives the BPSK signal, the demodulated data signal RDT and a transition signal DC2 and outputs a control clock signal to the controller 5. Refer to FIG. 14, FIG. 18 and FIG. 19. It is preferred: while a pulse appears in the transition signal DC2 within a specified cycle of the second control signal N2, the control clock signal CCK output by the control clock generator 6 is forbidden having transition in the cycle. The control clock generator 6 includes a second XOR gate 63, a NOR gate 64 and a second hazard-remover 65. The second XOR gate 63 receives the BPSK signal and the demodulated data signal RDT, undertakes an XOR operation, and outputs a second control signal N2. The NOR gate 64 is electrically connected with the XOR gate 63. The NOR gate 64 receives the second control signal N2 and the transition signal DC2 to undertake a NOR operation, and outputs a third control signal N3. The second hazard-remover 65 is electrically connected with the NOR gate 64, removing the hazard of the third control signal N3 and outputting a control clock signal CCK. It is preferred: the second hazard-remover 65 includes a third delay element 651, and a second NOR gate 652. The third delay element 651 receives the third control signal N3, delays the third control signal N3 by a third delay time, and outputs a delayed second control signal S3. The second NOR gate 652 is electrically connected with the third delay element 651, receives the delayed second control signal S3 and the third control signal N3 to undertake a NOR operation, and outputs a control clock signal CCK to the controller 5. However, the present invention does not limit that the second hazard-remover must be realized in the way mentioned in the above embodiments. Refer to FIG. 19. It should be noted: the phase detector persistently detects whether the BPSK signal is aligned to the rising edges of the accumulated delayed signal S2; while a pulse appears in the transition signal DC2, the control clock signal CCK output by the control clock generator is forbidden having transition in the corresponding cycle lest wrong locking actions happen. Besides, the background calibration method is used to undertake locking actions in this embodiment, whereby to counteract the variations of the process, voltage and temperature and enhance the reliability of the circuit.

Figure 20:
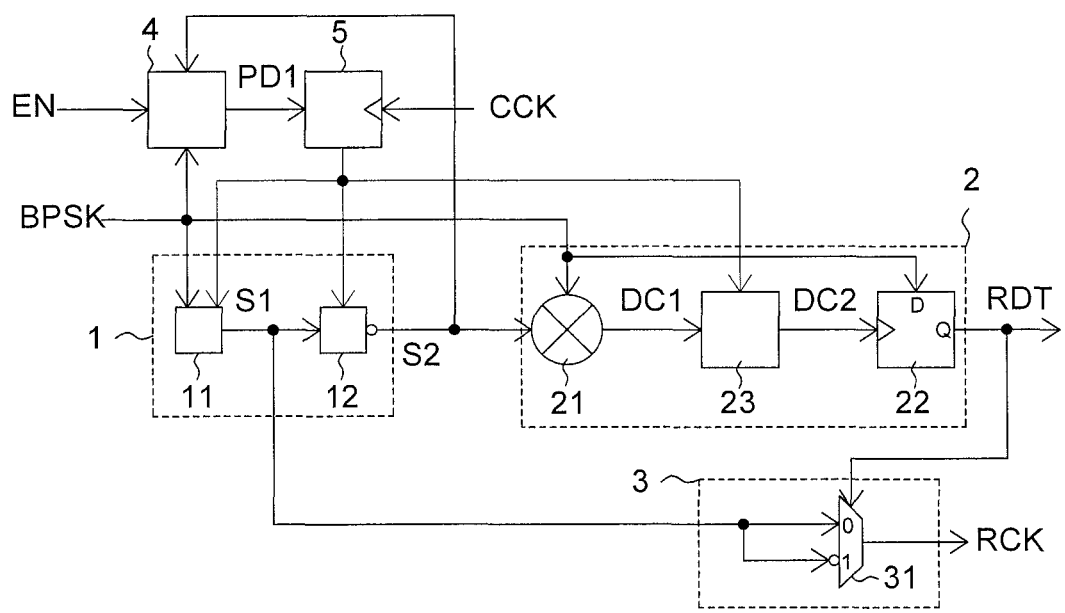
FIG. 20 is a diagram schematically showing a BPSK demodulator according to a still further embodiment of the present invention.
Figure 21:
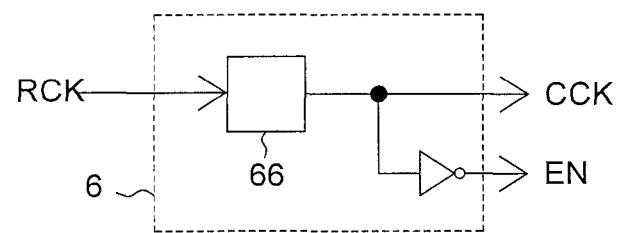
FIG. 21 is a diagram schematically showing a control clock generator according to a still further embodiment of the present invention.
Figure 22:
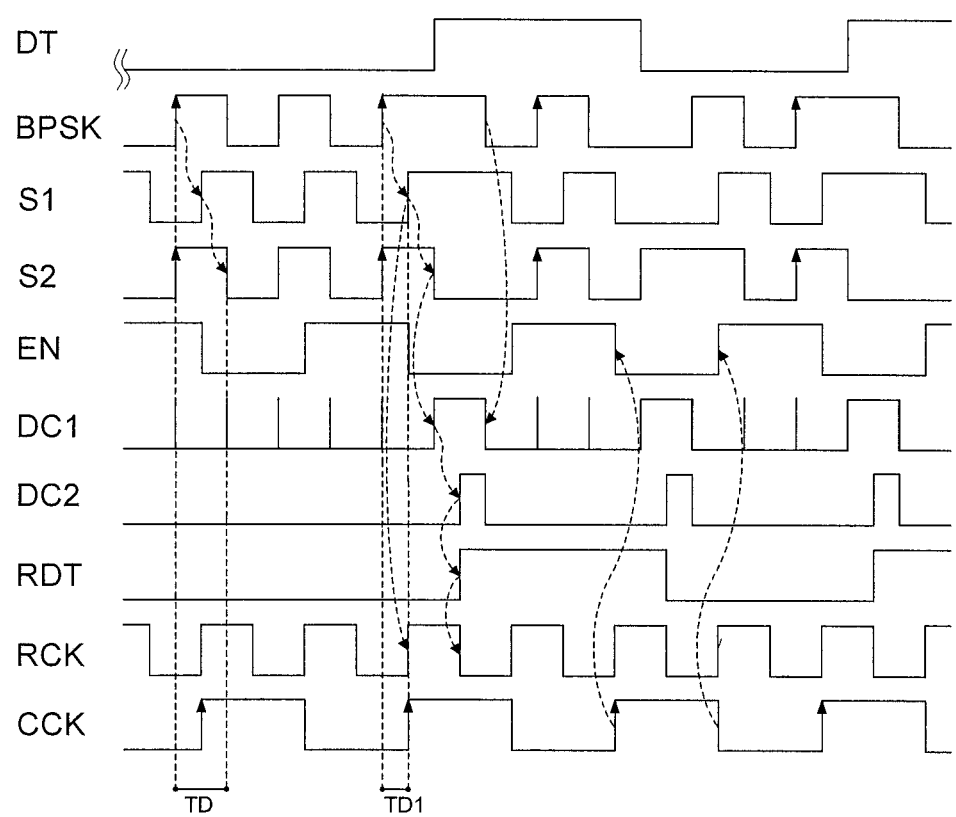
FIG. 22 is a timing diagram showing the signals related with a BPSK demodulator according to a still further embodiment of the present invention.

In the present invention, the circuit architectures using the background calibration method are not limited to the abovementioned embodiments but further include other embodiments. Refer to FIGS. 20-22. In one embodiment, a clock controller 6 includes a frequency divider 66. The frequency divider 66 receives a carrier clock signal RCK and outputs a control clock signal CCK and an enabling signal EN. According to the rising edge of the carrier clock signal RCK, the frequency divider 66 outputs a control clock signal CCK to the controller 5 and outputs an enabling signal EN to the phase detector 4, wherein the phases of the control clock signal CCK and the enabling signal EN are opposite. Thus, the controller 5 changes the control code in the rising edge of the control clock signal CCK, and the phase detector 4 acts while the enabling signal is at a high level (i.e. "1" in the digital signal). Although the abovementioned operations decelerate the data rate, the background calibration method can still be used to undertake locking actions after data transmission begins, whereby to counteract the variations of the process, voltage, and temperature and enhance the reliability of the circuit. It should be explained: if the data rate is 1/M times the carrier frequency, the divisor of the frequency divider may be a factor of M except "1". In this embodiment, the data rate is a half of the carrier frequency, and thus "2" is chosen as the divisor of the frequency divider, as shown in FIG. 22. The phase detector persistently detects whether the BPSK signal is aligned to the rising edges of the accumulated delayed signal S2, and the locking actions are undertaken in the background calibration method.

On the whole, the present invention at least has the following advantages:

1. Absolute stability: the delay circuit is an open loop and free of the problem of instability.
2. High data rate: because of absolute stability of the circuit, the data rate of the present invention can reach the maximum data rate of the BPSK signal.
3. Low power consumption: compared with the conventional BPSK demodulator, the present needn't use power-consuming oscillators.
4. Simple circuit structure: the simple circuit structure enables the present invention to be realized by digital circuits and analog circuits.
5. Low supply voltage: in a wireless power transmission system, the lower the voltage supplied to the receiver circuit, the longer the transmission distance; in a digital circuit, the present invention decreases the supply voltage and significantly reduces dynamic power consumption and static power consumption.
6. Small area: the circuit of the present invention needs none low-frequency filter and uses less passive elements.
7. 50% duty cycle of the recovery clock: The carrier clock signal output by the BPSK demodulator can be used by other circuits; 50% duty cycle is very important for digital circuits and DRAM.
8. Anti-PVT variation capability: the delay circuit can be controlled by the delay-locked loop; while locked, the circuit of the present invention can counteract the variations of processes, voltage and temperature and have enhanced reliability.

In conclusion, the present invention proposes a BPSK demodulator, which uses a delay circuit to delay a BPSK signal and mixes the delayed BPSK signal with the undelayed BPSK signal to output a demodulated data signal, and which uses a phase rotation circuit and the demodulated data signal to obtain a carrier clock signal. As the delay circuit is an open loop, it needn't use a complicated circuit to solve the problem of instability. Because of absolute stability of the circuit, the data rate of the present invention can reach the maximum data rate of the BPSK signal. Because the operating frequency of the delay circuit is the same as or 0.5 times the carrier frequency, the present invention consumes less power and is realized by digital circuits and analog circuits. Owing to using a delay-locked loop to execute locking actions in a foreground or background calibration method, the present invention can counteract variations of processes, voltage and temperature and enhance reliability of the circuit.

What is claimed is:

1. A binary phase shift keying demodulator comprising:
   a delay circuit receiving a binary phase shift keying (BPSK) signal and delaying said BPSK signal by an accumulated delay time to output an accumulated delayed signal; and
   a decision circuit electrically connected with said delay circuit and comprising:
      a first XOR gate mixing said BPSK signal and said accumulated delayed signal to output a heterodyning signal; and
      a flip-flop electrically connected with said first XOR gate and changing a demodulated data signal output by said flip-flop according to a logic state of said heterodyning signal.

2. The binary phase shift keying demodulator according to claim 1, wherein said accumulated delay time meets a relationship:

$$0.25T \leq TD < ((F/R) - 0.25)T,$$

wherein TD is said accumulated delay time, T is a carrier period of said BPSK signal, F is a carrier frequency of said BPSK signal, and R is a data rate of said BPSK signal.

3. The binary phase shift keying demodulator according to claim 1, wherein said flip-flop includes a D-type flip-flop, which receives said heterodyning signal and said BPSK signal and samples said BPSK signal according to said logic state of said heterodyning signal to output said demodulated data signal.

4. The binary phase shift keying demodulator according to claim 1, wherein said flip-flop includes a T-type flip-flop, which receives said heterodyning signal and changes a data logic state of said demodulated data signal output by an output terminal of said T-type flip-flop according to said logic state of said heterodyning signal.

5. The binary phase shift keying demodulator according to claim 1, wherein said decision circuit further includes:
   a first hazard-remover arranged between and cascaded with said first XOR gate and said flip-flop and used to remove a hazard of said heterodyning signal and generate a transition signal, and wherein said flip-flop changes said demodulated data signal output by said flip-flop according to a transition logic state of said transition signal.

6. The binary phase shift keying demodulator according to claim 1, wherein said delay circuit is controlled by a delay-locked loop.

7. The binary phase shift keying demodulator according to claim 6, wherein said delay circuit functions as a delay line of said delay-locked loop.

8. The binary phase shift keying demodulator according to claim 7, wherein said delay-locked loop includes:
   a phase detector detecting a phase difference of said BPSK signal and said accumulated delayed signal to output a comparison signal; and
   a first controller electrically connected with said phase detector and said delay circuit and controlling said accumulated delay time according to said comparison signal.

9. The binary phase shift keying demodulator according to claim 8 further comprising a control clock generator, which receives said BPSK signal, said demodulated data signal and said heterodyning signal, and outputs a control clock signal to said first controller, wherein while a heterodyning logic state of said heterodyning signal changes, said control clock generator disables said control clock signal.

10. The binary phase shift keying demodulator according to claim 9, wherein said control clock generator includes:
    a second XOR gate receiving said BPSK signal and said demodulated data signal to undertake XOR operation and output a second control signal;
    a NOR gate electrically connected with said second XOR gate and receiving said second control signal and said heterodyning signal to undertake NOR operation and output a third control signal; and
    a second hazard-remover electrically connected with said NOR gate to remove a hazard of said third control signal and output said control clock signal, wherein a Boolean function of said control clock generator is expressed by $$N3 = \overline{(\overline{BPSK} \oplus \overline{RDT}) + DC1}$$

wherein N3 is said third control signal, BPSK is said BPSK signal, RDT is said demodulated signal, and DC1 is said heterodyning signal.

11. The binary phase shift keying demodulator according to claim 1 further comprising:
    a phase rotation circuit electrically connected with said delay circuit and said decision circuit and inverting said BPSK signal or said accumulated delayed signal output by said delay circuit according to said demodulated data signal output by said decision circuit to output a carrier clock signal, wherein a Boolean function of said rotation circuit is expressed by $$RCK = BPSK \oplus RDT \text{ or } RCK = S2 \oplus RDT$$

wherein RCK is said carrier clock signal, RDT is said demodulated data signal, BPSK is said BPSK signal, and S2 is said accumulated delayed signal.

12. The binary phase shift keying demodulator according to claim 11, wherein said delay circuit includes:
    a first delay element receiving said BPSK signal and delaying said BPSK signal by a first delay time to output a first delayed signal, wherein said first delay time meets relationships:

$$\text{Max}\{0, TR - 0.5T\} \leq TD1 < TR + 0.5T, \text{ and } TR = TRD - TMD,$$

wherein TMD is a time point of transition of an raw data signal, TRD is a time point of transition of said demodulated data signal, TR is a time for demodulation of said demodulated data signal, and TD1 is said first delay time; and
    a second delay element cascaded with said first delay element, receiving said first delayed signal, and delaying said first delayed signal by a second delay time to output a second delayed signal as said accumulated delayed signal,
    wherein said rotation circuit inverts said BPSK signal, said first delayed signal or said accumulated delayed signal according to said demodulated data signal output by said decision circuit to output a carrier clock signal, and wherein a Boolean function of said rotation circuit is expressed by $$RCK = BPSK \oplus RDT, RCK = S1 \oplus RDT, \text{ or } RCK = S2 \oplus RDT$$

wherein RCK is said carrier clock signal, RDT is said demodulated data signal, BPSK is said BPSK signal, S1 is said first delayed signal, and S2 is said accumulated delayed signal.

13. The binary phase shift keying demodulator according to claim 11, wherein said delay circuit includes:
    a first delay element receiving said BPSK signal and delaying said BPSK signal by a first delay time to output a first delayed signal, wherein said first delay time meets relationships:

$$\text{Max}\{0, TR-0.5T\} \leq TD1 < TR+0.5T, \text{ and } TR=TRD-TMD,$$

Wherein TMD is a time point of transition of an raw data signal (DT), TRD is a time point of transition of said demodulated data signal (RDT), TR is a time for demodulation of said demodulated data signal, and TD1 is said first delay time; and a second delay element receiving said BPSK signal, and delaying said BPSK by said accumulated delay time to output said accumulated delayed signal, wherein said rotation circuit inverts said BPSK signal, said first delayed signal or said accumulated delayed signal according to said demodulated data signal output by said decision circuit to output a carrier clock signal, and wherein a Boolean function of said rotation circuit is expressed by $$RCK = BPSK \oplus RDT, RCK = S1 \oplus RDT, \text{ or}$$
$$RCK = S2 \oplus RDT$$

wherein RCK is said carrier clock signal, RDT is said demodulated data signal, BPSK is said BPSK signal, S1 is said first delayed signal, and S2 is said accumulated delayed signal.

14. The binary phase shift keying demodulator according to claim 11 further comprising:

a phase detector detecting a phase difference of said BPSK signal and said accumulated delayed signal to output a comparison signal; and a first controller electrically connected with said phase detector and said delay circuit and controlling said accumulated delay time according to said comparison signal.

15. The binary phase shift keying demodulator according to claim 14, wherein said first controller receives said carrier clock signal as a control clock signal.

16. The binary phase shift keying demodulator according to claim 14 further comprising a control clock generator, which includes:

a second controller receiving said carrier clock signal and outputting a first control signal; and a NAND gate receiving said first control signal and said carrier clock signal to undertake NAND operation and output a control clock signal to said first controller.

17. The binary phase shift keying demodulator according to claim 14 further comprising a control clock generator, which includes:

a frequency divider receiving said carrier clock signal and outputting a control clock signal to said first controller and outputting an enabling signal to said phase detector according to rising edges of said carrier clock signal.

* * * * *